Jan. 27, 1953 G. P. DE MENGEL 2,627,032

ELECTRIC WAVE GENERATOR

Filed June 19, 1947 3 Sheets-Sheet 1

Gaston Pakenham de Mengel Inventor

By [signature]

Attorney

Jan. 27, 1953 G. P. DE MENGEL 2,627,032

ELECTRIC WAVE GENERATOR

Filed June 19, 1947 3 Sheets-Sheet 2

Gaston Pakenham de Mengel
Inventor

By [signature]

Attorney

Jan. 27, 1953 G. P. DE MENGEL 2,627,032

ELECTRIC WAVE GENERATOR

Filed June 19, 1947 3 Sheets-Sheet 3

Inventor
Gaston Pakenham de Mengel
By R. P. Morris
Attorney

Patented Jan. 27, 1953

2,627,032

UNITED STATES PATENT OFFICE 2,627,032

ELECTRIC WAVE GENERATOR

Gaston Pakenham de Mengel, London, England, assignor to International Standard Electric Corporation, New York, N. Y., a corporation of Delaware Application June 19, 1947, Serial No. 755,760
In Great Britain May 16, 1946

Section 1, Public Law 690, August 8, 1946
Patent expires May 16, 1966

8 Claims. (Cl. 250—36)

This invention relates to electric wave generators employing electron discharge devices and more particularly to such generators in which the oscillation frequency may be made to depend upon an applied polarisation. Such generators are useful, for example, in frequency modulation circuits and in automatic tuning correction circuits.

The present invention makes use of a two terminal network, including at least one electron discharge device, having an impedance with a reactive component the magnitude of which is a function of polarisation applied between two points in the network. Such a circuit is hereinafter termed an electronic reactance circuit.

It is known to use an electronic reactance circuit in shunt to the frequency determining portion of another circuit employing an electron discharge device or devices connected to generate oscillations.

It is also known that an electronic reactance circuit may be constructed to have an input impedance with a negative conductance component, in which case if an impedance be connected across its terminals the network becomes self oscillatory, to such an extent that the magnitude of the oscillations is limited only by overloading of the electron discharge device or devices in the circuit. This considerably impairs the frequency controlling effect of applied polarisation.

According to one feature of the present invention I provide an electric oscillation generator comprising a two terminal network including at least one electron discharge device and having an impedance with a negative conductance component and a susceptance component the magnitude of which is a function of polarisation applied between two points, in said network, and an impedance connected across the terminals of said network which automatically controls the power dissipation.

The principle of the invention and certain embodiments thereof will be described with reference to the accompanying drawings in which.

Figure 1:
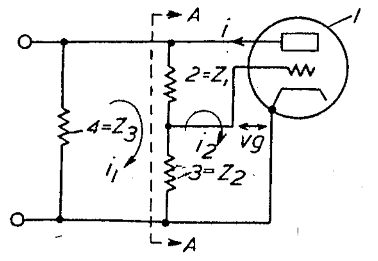
Fig. 1 is a simplified circuit diagram of an electronic reactance circuit, to explain the principles of the invention.

In Fig. 1 there is represented a triode valve 1 having impedance connections 2, 3 and 4 between anode and grid, grid and cathode and anode and cathode respectively with impedance values $Z_1$, $Z_2$, $Z_3$ respectively. Although a triode is here represented, the device 1 may be any type of device such as an amplifier circuit or a multielectrode valve which may be adequately described by the statement that when appropriate steady polarising potentials (not shown) are applied to its electrodes and an incremental voltage $v_g$ is applied to its input terminals, an incremental current $i$ shall flow in the external circuit between its output terminals, $i$ being given by the expression $$i = gv_g \qquad (1)$$

It is also assumed that any internal impedances, such as interelectrode impedances in the case of a single valve, may be considered as lumped in the external impedances $Z_1$, $Z_2$ and $Z_3$. Thus, if device 1 be any amplifier circuit, the input impedance is to be considered as part of $Z_2$, the output impedance as part of $Z_3$, and any mutual impedance between output and input terminals is to be considered as included in $Z_1$. It is also assumed that electron transit time and other phasing effects within the device 1 may be neglected so that the quantity $g$ in (1) is a real number. Finally, it is assumed that the contribution to $Z_1$ and $Z_2$ of internal impedances in device 1 shall remain substantially constant with respect to changes in the value of $g$ due to variations of polarising potentials to be applied to alter this value.

Taking circulatory currents as shown in Fig. 1, we have for the mesh equations $$\begin{gathered} i_2 = -gv_g = g(i_1 - i_2)Z_2 \\ i_1(Z_1+Z_2+Z_3) - i_2(Z_1+Z_2) = i_0 Z_3 \\ V_0 = (i_0 - i_1)Z_3 \end{gathered} \qquad (2)$$

Solving these equations, and, for convenience, writing $Y_1 = 1/Z_1$, $Y_2 = 1/Z_2$, and $Y_3 = 1/Z_3$ we obtain for the input admittance $$i_0/V_0 = Y_3 + \frac{Y_1}{Y_1+Y_2}(Y_2 - g) \qquad (3)$$

From the point of view of impedance variations we are interested in the right hand term of Equation 3 which we shall denote by $Y_R$, having the form $G_R + jS_R$.

In general in the following equations G denotes conductance and S susceptance. These symbols are used with suffixes the same as the admittances to which they correspond. In accordance with usual practice in the art we shall now assume that either $Y_1$ is a pure susceptance and $Y_2$ a pure conductance or vice versa. It is customary also to make other simplifying assumptions, which it is not proposed here to do, and the more general treatment leads to results which it is believed have not previously been disclosed. Substituting for $Y_1$ and $Y_2$ in (3), separating into real and imaginary parts, and writing $\alpha$ for $S/G$, we obtain for the two cases mentioned Case 1: $Y_1$ pure susceptance
$Y_2$ pure conductance $$G_1=0=S_2$$

$$G_R=-\frac{\alpha^2}{1+\alpha^2}(g-G_2)$$

$$S_R=-\frac{\alpha}{1+\alpha^2}(g-G_2)$$

Case 2: $Y_1$ pure conductance
$Y_2$ pure susceptance $$G_2=0=S_1$$

$$G_R=-\frac{g-\alpha^2 G_1}{1+\alpha^2}$$

$$S_R=\frac{\alpha}{1+\alpha^2}(G_1+g) \qquad (4)$$

where $G_R$ and $S_R$ are the conductance and susceptance as seen from the line A—A in Fig. 1. In order that the circuit as a whole as represented in Fig. 1 may oscillate we must have $$G_3+G_R=0=S_3+S_R$$

Hence, from Equation 4, it is seen that in Case 1 we must have $g>G_2$ and in Case 2, $g>\alpha^2 G_1$. If we limit consideration to the cases where the reactance elements of the circuit are either separate inductances or capacities, we obtain for the proportional frequency deviation $$\frac{d\omega}{\omega}$$

resulting from a change of $g$ in Case 1

$$\frac{d\omega}{\omega}=\pm\tfrac{1}{2}\left(1+\frac{1}{\alpha^2}\right)\frac{dg}{g+G_2} \qquad (5a)$$

The positive sign applies when $S_1$ is a capacitance and the negative when $S_1$ is an inductance. Correspondingly in Case 2 we obtain $$\frac{d\omega}{\omega}=\mp\tfrac{1}{2}(1+\alpha^2)\frac{dg}{g+G_1} \qquad (5b)$$

In both cases the corresponding change required of $G_3$ is given simply by $$dG_3=dg \qquad (6)$$

It is of interest to note that in Case 1 if $S_1$ is a capacitance, $S_3$ must always be capacitative, and we shall have an oscillator in which no inductances are required.

It is a fundamental assumption of the above analysis that device 1 of Fig. 1 shall operate linearly, i. e. overloading must be avoided. In the normal oscillator, oscillations build up until limited by curvature of the valve characteristic and/or onset of grid current. In carrying out the present invention overloading of the valve circuit may be avoided by comprising in $G_3$ a device whose conductance is automatically controlled by the current flowing through it or the voltage across it. It is to be preferred that the time taken for $G_3$ to assume the value required to balance $G_R$ should be long compared to the period of oscillation, but the operation should be rapid compared with the rate of change of $g$. In applications of the invention to automatic tuning correction and to frequency modulation at low modulating frequencies, thermally controlled resistance of the well-known thermistor type are very suitable. It should be remembered in connection with the value of $G_3$ required, that $G_3$ includes also the equivalent output conductance of device 1—i. e. the anode-cathode impedance in the case of a valve as depicted. This conductance may well be a function of grid bias or other control voltage, i. e. it may be a function of $g$, in which case it may be possible to make use of it in order to contribute to the variation of $G_3$ as required by Equation 6. It may also be of advantage to include in $G_3$ a resistance element whose value depends on the control voltage or current used to vary $g$, so as to allow of the use of an automatically self-adjusting resistance of long time constant for bringing $G_3$ to its mean value.

Figure 2:
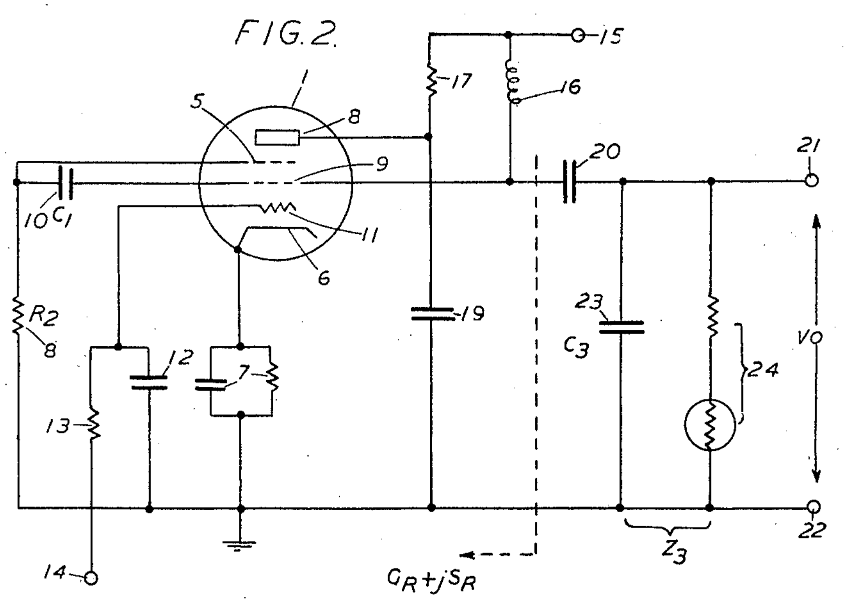
Fig. 2 is a circuit diagram of an embodiment of the present invention.

Referring once more to Equation 4 it will be seen that the circuits under discussion cannot be self-oscillatory if the sign of $g$ be reversed. This means that the device 1 of Fig. 1 cannot in practice be a simple triode as there depicted. In a multi-electrode valve it is, however, possible to obtain the equivalent of a triode with an inphase relationship between output current and input voltage. The familiar transitron is virtually such an arrangement. In this a positive potential is applied to the screen grid of a pentode and a lower potential is applied to the anode; the normal control grid is used merely to control the average electron current, while the suppressor and screen grids respectively correspond to the control grid and anode of device 1. In Fig. 2 there is illustrated a practical circuit according to the invention using a transitron arrangement.

In Fig. 2 device 1 is a pentode valve, suppressor grid 5 corresponds to the control grid of Fig. 1. The cathode 6 is taken to ground through a biasing resistance and decoupling condenser 7. A resistance 8 connected between grid 5 and ground and of value $R_2$ corresponds to $Z_2$ in Fig. 1. Screen grid 9 corresponds functionally to the anode of Fig. 1. Impedance element 10 of value $C_1$ corresponds to $Z_1$ of Fig. 1. The normal control grid 11 is connected to ground via condenser 12 and to a source of bias potential via decoupling resistance 13 and terminal 14. This bias potential forms a convenient method of altering the effective $g$ of device 1, in order to vary the output frequency. A positive potential is applied to electrode 9 from terminal 15 through decoupling choke 16, while a lower potential derived from the same source via voltage dropping resistance 17 is applied to electrode 18, the normal anode, which is decoupled to ground through condenser 19. Electrode 9 is connected via D. C. blocking condenser 20 to terminal 21 and the oscillator output is taken from terminals 21 and 22. Across the output terminals are connected a condenser 23 of value $C_3$ and thermistor resistance combination 24 comprising a fixed resistance in series with a thermistor. These impedances together with the output load and the impedance between electrode 9 and ground correspond to the $Z_3$ of Fig. 1. If we write $\omega R_2 C_1=\alpha$ and $G_2=1/R_2$, $$Y_3=1/Z_3=G_3+j\omega C_3$$

it will be evident that this circuit constitutes a practical embodiment of the theoretical circuit described above with reference to Case 1 of Equation 4, the admittance to the left of the dotted line in Fig. 2, being $G_R+jS_R$. The value of the fixed resistor in combination 24 is chosen so as to make $V_0$ constant as for example in the manner explained in my U. S. application No. 639,292, Stabilised Electric Oscillators, filed January 5, 1946. The value of $V_0$ is chosen so that the magnitude $$\frac{V_0}{\sqrt{1+\alpha^2}}$$

of oscillation potential appearing between electrode 5 and ground is insufficient to cause space current to flow through $R_2$ or to exceed the limits of substantial linearising for the device.

My U. S. application No. 639,292 describes and claims the use of non-linear resistances such as thermistors for the purpose of providing an automatically variable conductance so as to allow of the remaining portion of the circuit to operate linearly and so provide an oscillator whose frequency is independent of electrode potential variations.

The present invention may be considered as an extension of the invention of the said application. That invention was applied to the case in which the frequency of oscillation was to be independent of electrode potential variations while the present invention extends the application to the case in which the frequency of oscillation is largely determined by electrode potential or equivalent variations.

It will be seen from the foregoing description given with reference to Fig. 2 that according to another feature of the invention I provide an electric oscillation generator comprising an electric wave translator including at least one electron discharge device, a first two terminal network including said translator and having as seen from its terminals a susceptive admittance the conductance component of which is negative and the susceptance component of which varies in sympathy with the change of transconductance of said translator, a second two terminal network having the properties of a non-linear conductance in shunt with a susceptance, said first and second networks being connected in parallel to form said generator, the frequency controlling properties of the said first network remaining substantially unaffected by the oscillation generated.

Figure 3:
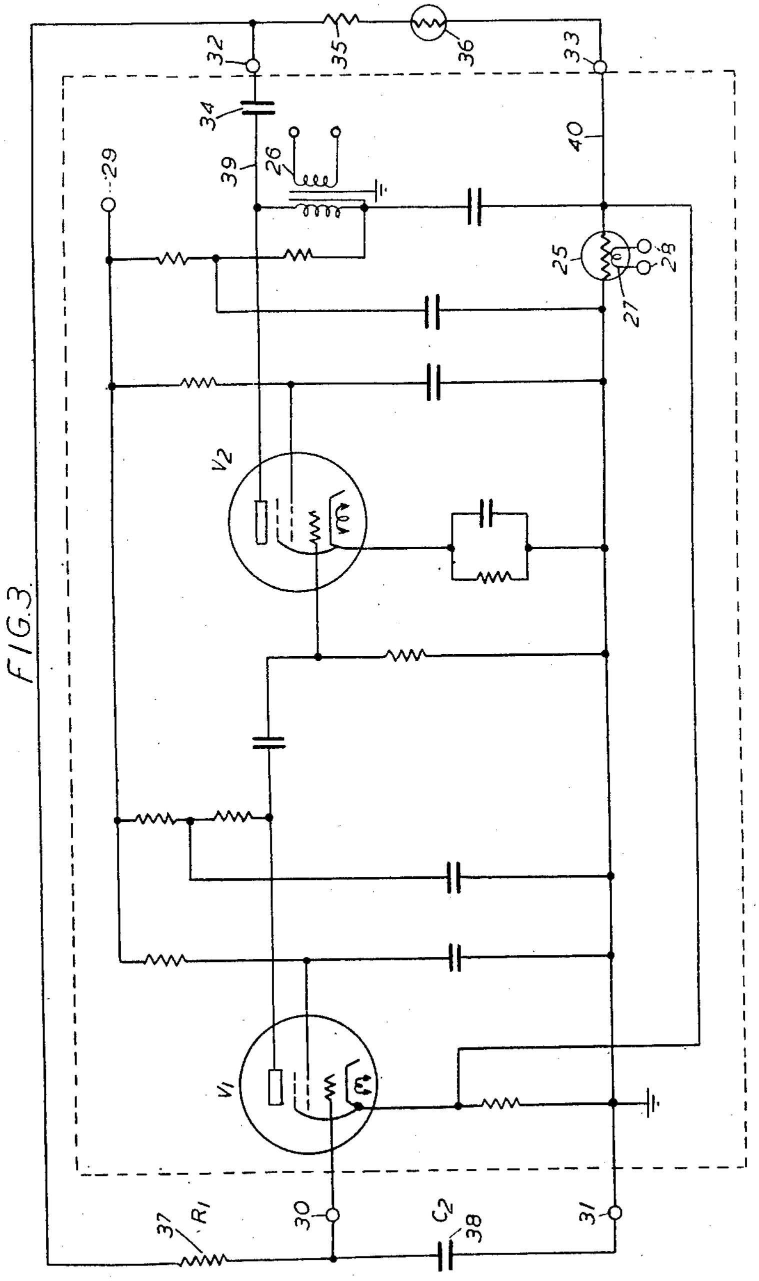
Fig. 3 is a circuit diagram of an oscillator according to the present invention in which a two stage negative feedback amplifier is used.

An example of a circuit in which the device 1 of Fig. 1 may be equivalent to a two stage feedback amplifier is shown in Fig. 3. The circuit inside the dotted lines is that of a two stage negative feedback amplifier having two electron discharge devices $V_1$ and $V_2$ in cascade in which an indirectly heated thermistor 25 provides current feedback to the cathode of $V_1$. Output to a load may be taken from the secondary of transformer 26. It is considered that this type of circuit is sufficiently well known without further description other than to point out that, if the loop gain is large, both input and output impedances of the amplifier will be very high, while the ratio of output current to input voltage is inversely proportional to the resistance of thermistor 25 and may be varied at will by altering the value of the current passing through the heating coil 27 of thermistor 25 via leads 28. Polarising potentials for the electrodes of $V_1$ and $V_2$ are derived in normal manner from terminal 29, while the valve heaters are supplied from any convenient source. Input terminals 30, 31 are connected in the manner shown in the figure to the grid of $V_1$ and the earth line respectively, while additional output terminals are designated 32 and 33, 32 being isolated from the D. C. supply circuit by means of blocking condenser 34. We now connect between terminals 32 and 33 a resistor 35 and thermistor 36 to form the variable part of conductance $G_3$. It is assumed that the resistance of thermistor 25 is low compared to $1/G_3$ so that terminal 33 is virtually at ground potential with respect to terminal 32. Terminals 32 and 30 are connected together through resistance 37 which may be referred to as $R_1$, while condenser 38, value $C_2$, is connected between the input terminals 30, 31. It will be recognized that the circuit of Fig. 3 falls in the category of Case 2 above and that $\alpha=\omega R_1C_2$. Such a circuit requires an inductive $S_3$ and this may well be supplied by the leakage inductance of transformer 26. It should be pointed out, in this connection, that the whole of the impedance of transformer 26, coupled to the secondary load, as seen from its primary terminals, forms part of $Z_3$. Further, it would be possible to connect the output terminals of 26 to terminals 32 and 33 instead of the leads 39 and 40 shown in the figure, provided the insertion phase shift of the transformer can be disregarded. Since the amplifier is largely stabilised against electrode potential variation, frequency control is obtained by variation of the heating current for thermistor 25.

As an alternative to the basic circuit of Fig. 1 a second type of basic circuit may be used which leads to substantially the same result. This alternative circuit, which is illustrated diagrammatically in Fig. 4, may be regarded as the "push pull" equivalent of that of Fig. 1.

Figure 4:
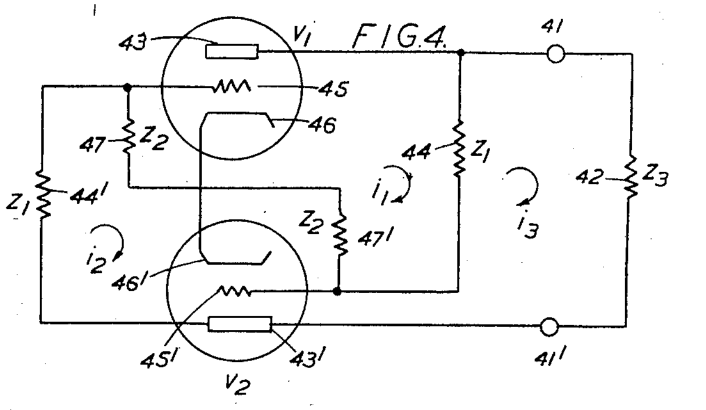
Fig. 4 is a simplified circuit diagram of a "push-pull" electronic reactance circuit analogous to that of Fig. 1.

Referring to Fig. 4, $V_1$ and $V_2$ represent two ordinary valves or amplifiers such that for each the output current is 180° out of phase with the input grid cathode voltage. As in the previous case, interelectric impedances are to be considered lumped in those designated in the figure, except that it will be assumed that, in each valve, anode-grid and anode-cathode admittances are negligible. For this reason, except of quite low frequencies, the valves would, in practice, be preferably pentodes. $V_1$ and $V_2$ may also, if desired, be replaced by amplifiers, say of a three stage negative-feedback type. In Fig. 4 terminals 41, 41′ separate the electronic reactance circuit on the left thereof and the two terminal network 42 of impedance $Z_3$ which includes a non-linear element to stabilise the generated oscillations. For convenience in analysis it will be assumed that for each valve the trans-conductance $g$ is the same. Anode 43 of $V_1$ is connected via element 44 of impedance $Z_1$ to grid 45′ of $V_2$ and thence to the commonest cathodes 46, 46′ via element 47′ of impedance $Z_2$. Similarly another pair of similar impedances connect anode 43′ of $V_2$ to cathode, the common junction of the impedances being connected to grid 45 of $V_1$. Circulatory currents $C_1$, $C_2$ and $C_3$ are shown, $i_1$ is taken to flow from anode 43 of $V_1$ through associated impedances 44 and 47′ back to cathode 46. The path of $i_2$ is similar with respect to $V_2$ while $i_3$ is taken to flow through 42, via anode 43′ of $V_2$ and associated impedances 44′ and 47 to the common cathode point and thence via the other pair of impedances 47′ and 44 back to $Z_3$. Consideration of the three resulting mesh equations enables us to write down the condition for oscillation in the form $$\begin{vmatrix} 1 & gZ_2 & gZ_2 \\ gZ_2 & 1 & -gZ_2 \\ -(Z_1+Z_2) & Z_1+Z_2 & Z_3+2(Z_1+Z_2) \end{vmatrix} = 0 \quad (7)$$

Resolution of the determinant and the writing of Y for $1/Z$, suffices being used as previously, give $$Y_1(Y_2-g)+2Y_3(Y_1+Y_2)=0 \quad (8)$$

As previously, we shall assume either $Y_1$ to be a pure susceptance and $Y_2$ a pure conductance, or vice versa and obtain in the two cases ($\alpha$ being written for $S/G$).

Case 1:

$$G_1=0=S_2$$

$$2G_3=\frac{\alpha^2}{1+\alpha^2}(g-G_2)$$

$$2S_3=\frac{\alpha}{1+\alpha^2}(g-G_2)$$

Case 2:

$$G_2=0=S_1$$

$$2G_3=\frac{g-\alpha^2 G_1}{1+\alpha^2}$$

$$2S_3=-\frac{\alpha}{1+\alpha^2}(g+G_1) \quad (9)$$

Figure 5:
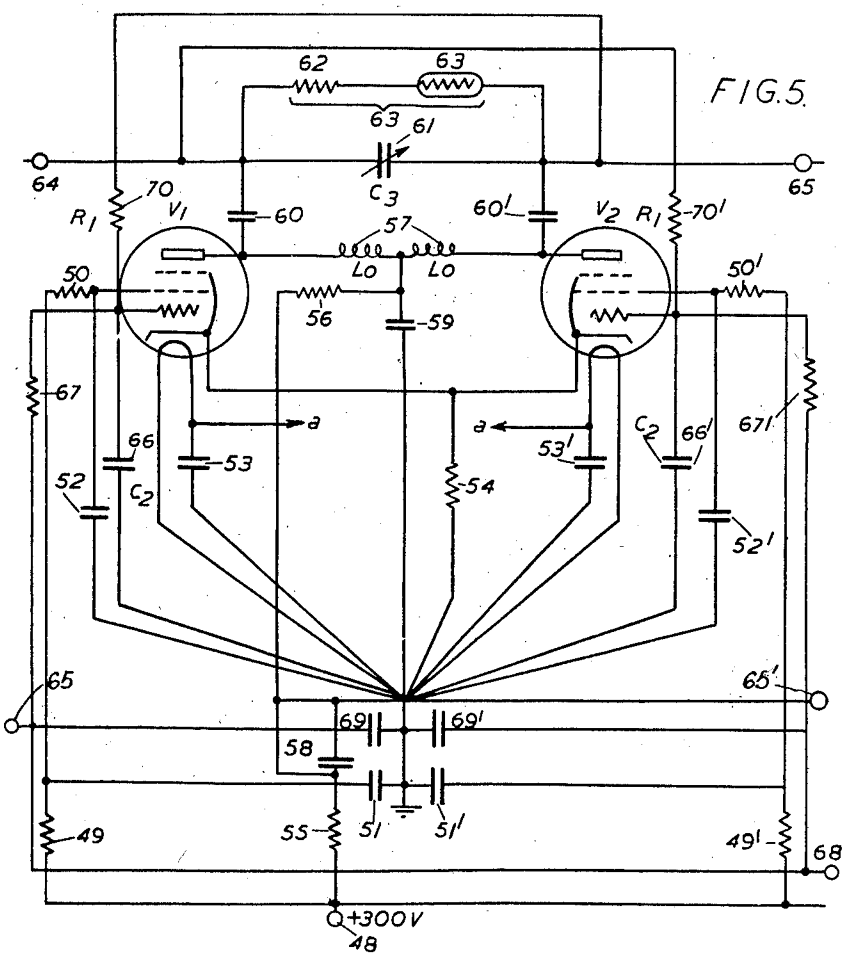
Fig. 5 is a circuit of an embodiment of the invention using a push-pull electronic reactance circuit.

The similarity of these equations with those in (4) above show that the circuit is identical in behaviour with that of Fig. 1. Although in the derivation of (9) it was assumed that for each valve anode-cathode admittances were negligible, this was not necessary, but merely convenient for analysis. If $Y_0$ be the direct admittance between anode and cathode of each valve, it may be shown that the only alteration to Equations 9 is the addition of $G_0$ or $S_0$, as the case may be, to the left hand sides of these equations. An embodiment of the push-pull circuit is illustrated in Fig. 5 which shows the local oscillator portion of a frequency changing circuit designed to cover a frequency range from approximately 6 to 33 mc./s. with automatic tuning correction $V_1$ and $V_2$ are H. F. pentodes. Polarising potentials for the screen-grids are taken from +300 v. terminal 48 via resistances 49, 49$^1$, 50, 50$^1$. Condensers 51, 51$^1$, 52, 52$^1$, decouple these supplies and maintain the screen grids at ground potential for high frequency. One side of each heater is grounded directly and the other ends are grounded through condensers 53 and 53$^1$ respectively, while heater current is injected at points *a*, *a*. The cathodes are commoned and connected to ground through resistance 54. No condenser is placed across this resistance, for if the two halves of the circuit are properly balanced no H. F. potential will be set up; while if they are not, the unbypassed resistor tends to correct the unbalance. Anode current is derived from terminal 48 and is taken via decoupling resistances 55 and 56 and centre-tapped tuning coil 57 to the respective valve anodes. Condensers 58 and 59 provide associated decoupling, the latter providing the effective ground connections for coil 57. The two halves of 57 may be considered as anode-cathode shunts to the valves and have the functions of $\gamma_0$ in the previous discussion, and are hence marked $L_0$. Condensers 60 and 60$^1$ are D. C. blocking condensers. The variable condenser 61 of capacity $C_3$ provides for approximate tuning and corresponds to $C_3$ in the formulae. Resistance 62 and thermistor 63 function as $G_3$ and provide constant voltages across the output terminals 64, 65, 64$^1$, 65$^1$ respectively. The grids of $V_1$ and $V_2$ are grounded through condensers 66, 66$^1$ which perform the functions of $C_2$ above, and are also connected via resistances 67, 67$^1$ to the discriminator via terminal 68 so that *g* may be altered by change of grid bias. 69 and 69$^1$ are grid bias decoupling condensers. Finally resistors 70 and 70$^1$ function as $R_1$, the reciprocal of $G_1$ in the above analysis.

The circuit shown comprises a network having terminals 64 and 65$^1$ having an impedance with a negative conductance component and the magnitude of which is a function of the polarisation applied between terminal 48 and ground, across which is an impedance (61, 62 and 63), which automatically controls the power dissipation.

Although the embodiments described all use simple impedances, elements, oscillating according to the present invention may have complex susceptance arms, but in such cases Equations 5 and 6 do not necessarily apply. In such cases where $Y_1$ and $Y_2$ are not respectively substantially pure, conductances and susceptances or vice versa, Equations 4 or 9 do not hold but require correction terms, which, in general, result in reduction in the range of operation and frequency deviation.

Although in the embodiment described thermistors have been used to control the power dissipation other non-linear devices may be used. For example, the conductance $G_3$ may include the anode-cathode impedance of an electron discharge device having an anode, a cathode and a control grid, the bias voltage on the latter being automatically dependent on the amplitude of the oscillations. An example of such an arrangement may be found in the U. S. application of M. M. Levy for "Generators of Electric Oscillations," Serial No. 477,390 filed February 27, 1943.

What is claimed is:

1. An electrical oscillation generator comprising an electric translator including at least one electron discharge device, a first two terminal network including said translator and having as seen from its terminals said discharge device connected therebetween to provide an admittance, the conductance component of which is negative and the susceptance component of which varies in response to a change in the transconductance of said translator, a second two terminal network including in shunt therewith an element having properties of nonlinear conductance, and a second element, the susceptance of which varies in response to potential variations between said terminals, and means connecting said first and second networks to form said generator.

2. An electric oscillation generator comprising an electric translator including at least one electron discharge device, a first two terminal network including said translator and having as seen from its terminals said discharge device connected therebetween to provide an admittance, the conductance component of which is negative and the susceptance component of which varies in response to a change in transconductance of said translator, a second two terminal network including in shunt therewith a thermal responsive resistance element having properties of non-linear conductance, and an element, the susceptance of which varies in response to potential variations between said terminals, and means connecting said first and second networks in parallel to form said generator.

3. An electrical oscillation generator comprising an electric translator including at least one electric discharge device connected for operation as a transitron, a first two terminal network including said translator and having said discharge device connected therebetween to provide an admittance, the conductance component of which is negative and the susceptance component of which varies in response to a change in transconductance of said translator, a second two terminal network including in shunt therewith both a thermal responsive resistance element having properties of non-linear conductance, and an element, the susceptance of which varies in response to potential variations between said terminals, and means connecting said first and second networks in parallel to form said generator.

4. An electric oscillation generator comprising an electric translator including at least two electron discharge devices, means connecting said devices for operation as a negative feedback amplifier, a first two terminal network including said translator and having as seen from its terminals said discharge device connected therebetween to provide an admittance, the conductance component of which is negative and the susceptance component of which varies in response to a change in transconductance of said translator, a second two terminal network including in shunt therewith both a thermal responsive resistance element having properties of non-linear conductance and an element, the susceptance of which varies in response to potential variations between said terminals, and means connecting said first and second networks to form said generator.

5. An electric oscillation generator having in combination, a pair of input terminals and a pair of output terminals, a multiple stage negative feedback amplifier associated with said input terminals in a manner to provide admittance, the conductance component of which is negative and the susceptance component of which varies in response to changes in transconductance of said negative feedback amplifier, a thermal responsive resistance connected in shunt with said output terminals, a second thermal responsive element series connected between one of said input and one of said output terminals, said second thermal responsive element being provided with an associated heater for variation of the conductance thereof, a source of heater current, means for varying said source of heater current, means for connecting said second thermal responsive element to said multiple stage negative feedback amplifier in a manner to provide current feedback from one of said output terminals to said amplifier, and means connecting said input and output terminal networks in parallel to form said generator.

6. An electrical oscillation generator comprising, an electric translator including an electron discharge device having an anode, a cathode, a control grid, a screen grid and suppressor grid, a first two terminal network including said translator and having as seen from its terminals said discharge device connected therebetween to provide admittance, the conductance component of which is negative and the susceptance component of which varies in response to a change in the transconductance of said translator, said translator including a pair of input terminals, one of which is connected to ground, an impedance connected between said grounded terminal and said suppressor grid, a capacitive impedance connected between said screen grid and a junction point between said suppressor grid and said first mentioned impedance, means maintaining said screen grid and said anode at a fixed positive potential from a common source, said anode being maintained at a lower positive potential than said screen grid, means maintaining said cathode above ground potential, and means connecting said control grid to said ungrounded input terminal, an output circuit including a two terminal network and including a blocking capacitor series connecting one of said output terminals to said screen grid, means connecting said other output terminal to ground, a capacitive impedance shunting said output terminals, and a thermally responsive impedance element additionally shunting said output terminals, whereby an input potential applied to said input terminals biasses said control grid to effect variation of oscillation generator frequency taken from said output terminals.

7. An electric oscillation generator comprising an electric translator including at least two electron discharge devices, means connecting said devices for operation as a push-pull amplifier, a first two terminal network including said translator and having as seen from its terminals said discharge devices connected therebetween to provide admittance, the conductance component of which is negative and the susceptance component of which varies in response to a change in transconductance of said translator, a second two terminal network including in shunt therewith both a thermal responsive resistance element having properties of non-linear conductance and an element the susceptance component of which varies in response to potential variations between said terminals, and means connecting said first and second networks to form said generator.

8. An electric oscillation generator comprising an electric translator including at least two electron discharge devices, means connecting said devices for operation as a push-pull negative feedback amplifier, a first two terminal network including said translator and having as seen from its terminals said discharge devices connected therebetween to provide admittance, the conductance component of which is negative and the susceptance component of which varies in response to a change in transconductance of said translator, a second two terminal network including in shunt therewith both a thermal responsive resistance element having properties of non-linear conductance and an element the susceptance component of which varies in response to potential variations between said terminals, and means connecting said first and second networks to form said generator.

GASTON PAKENHAM DE MENGEL.

REFERENCES CITED

The following references are of record in the file of this patent:

UNITED STATES PATENTS

| Number | Name | Date |
|---|---|---|
| 2,130,272 | Ford | Sept. 13, 1938 |
| 2,181,909 | Peterson | Dec. 5, 1939 |
| 2,226,561 | Herold | Dec. 31, 1940 |
| 2,260,545 | Stark | Oct. 28, 1941 |
| 2,341,067 | Wise | Feb. 8, 1944 |
| 2,396,088 | Crosby | Mar. 5, 1946 |
| 2,417,805 | Barnard et al. | Mar. 25, 1947 |
| 2,439,245 | Dunn | Apr. 6, 1948 |